United States Patent
Iwata (10) Patent No.: US 7,919,793 B2
(45) Date of Patent: Apr. 5, 2011

(54) SEMICONDUCTOR INTEGRATED CIRCUIT

(75) Inventor: Shusuke Iwata, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/588,938

(22) Filed: Nov. 3, 2009

(65) Prior Publication Data

US 2010/0187573 A1 Jul. 29, 2010

(30) Foreign Application Priority Data

Jan. 23, 2009 (JP) ................................. 2009-012955

(51) Int. Cl.
*H01L 27/10* (2006.01)
*G06F 17/50* (2006.01)

(52) U.S. Cl. ........ 257/206; 257/204; 257/208; 257/241; 257/219; 257/357; 257/E21.615; 257/E25.016; 257/E27.046; 438/142; 716/112; 716/113; 716/119

(58) Field of Classification Search .................. 257/204, 257/206, 208, 219, 241, 357, E21.615, E25.016, 257/E27.046; 438/142; 716/119
See application file for complete search history.

(56) References Cited

U.S. PATENT DOCUMENTS

| 6,369,412 B1 * | 4/2002 | Ueda et al. ..................... 257/206 |
| 7,562,326 B2 * | 7/2009 | Wang et al. .................... 716/119 |
| 2005/0044522 A1 * | 2/2005 | Maeda ............................ 716/18 |
| 2007/0111405 A1 * | 5/2007 | Watanabe et al. ............. 438/142 |

FOREIGN PATENT DOCUMENTS

JP 2006-269900 10/2006

* cited by examiner

*Primary Examiner* — Dao H Nguyen
(74) *Attorney, Agent, or Firm* — Rader, Fishman & Grauer PLLC (57) ABSTRACT

Disclosed herein is a semiconductor integrated circuit including: a plurality of standard cells including a transistor having a gate electrode and arranged in combination with each other; a metallic wiring layer interconnecting the standard cells to form a desired circuit; and a plurality of reserve cells having a gate electrode, unconnected with the metallic wiring layer and arranged on a periphery of the standard cells, wherein each of the gate electrodes of the standard cells and the reserve cells has a gate pad section and two gate finger sections extending from the gate pad section to sides opposite to each other in a predetermined direction, and length of the gate pad sections of the reserve cells in a direction orthogonal to the predetermined direction is equal to or more than a sum total value of three times a minimum line width in the metallic wiring layer and twice a minimum separation distance.

8 Claims, 8 Drawing Sheets

SEMICONDUCTOR INTEGRATED CIRCUIT

BACKGROUND OF THE INVENTION

1. Field of the Invention

The present invention relates to a semiconductor integrated circuit in which a desired circuit is formed by arranging a plurality of circuit cells (for example standard cells) including a transistor having a gate electrode in combination with each other and interconnecting the cells by a metallic wiring layer.

2. Description of the Related Art

Because progress has been made in miniaturization of semiconductor LSIs (Large Scale Integrations), a ratio between delay within a logic circuit element (which delay will hereinafter be referred to as "gate delay") and wiring delay is changing greatly.

A past LSI that did not advanced so much in miniaturization had a high ratio of gate delay to wiring delay among elements accounting for signal delays of the whole LSI or a whole circuit block. Thus, in estimating the delay of a whole signal path in a stage of logic synthesis of LSI design, a total amount of delay did not greatly deviate from a prediction unless there is an error in estimating each gate delay.

Progress made in miniaturization in recent semiconductor processes has increased a ratio of wiring delay to a total signal delay. It is therefore important to estimate wiring delay correctly.

However, in the stage of logic synthesis, a state of wiring layout is not known, and thus wiring delay cannot be determined and is difficult to estimate. It is therefore difficult to estimate timing of operation in a whole signal path.

For example, unless an amount of delay in a circuit part up to a preceding stage connected to each of a plurality of inputs of a certain gate circuit can be estimated with a certain degree of accuracy, it is not possible to estimate timing in consideration of the delay of each input with respect to the operation of the gate circuit and a tolerable amount of delay (delay margin). Estimations of timing in such individual gate circuits are totaled, and timing design is made for correct operation in a whole signal path. However, uncertainty of wiring delay introduces a large error into estimation of timing in the whole signal path.

Thus, a path delay time estimated by a logic synthesis tool and a path delay time in an actually completed LSI deviate from each other, and erroneous operation, that is, erroneous logical inversion tends to occur. A difficulty in securing a noise margin due to the lowering of voltage also spurs an increase in frequency of erroneous logical inversion.

In addition, the miniaturization of semiconductor elements has enabled the incorporation of more logic gate circuits, complicated logic, and increased the frequency of logical errors.

For such reasons, ECOs (Engineering Change Orders: requests for a circuit change after design) from a client requesting design are expected to increase before or after completion of the design or at a time of sample evaluation.

As a method for dealing with an ECO at a low cost and in a short time, a method of embedding reserve cells for circuit change after design in unused parts of a standard cell arrangement region is known (see for example Japanese Patent Laid-Open No. 2006-269900).

A reserve cell will hereinafter be referred to as an "ECO cell" or an "ECO filler." In addition, such a design method will hereinafter be referred to as an "ECO cell aided design."

SUMMARY OF THE INVENTION

Generally, at least one of sizes in two orthogonal directions (what is called a vertical direction and a horizontal direction) of standard cells is standardized into a few types, for example about three types. The size in the so-called vertical direction is referred to as the "height" of standard cells, and the height is standardized or unified into about three types. Because the size (height) of the cells is confused with structural height in a direction perpendicular to a semiconductor substrate and thus causes misunderstanding, the size of the cells will not hereinafter be referred to as "height." Instead, this size will hereinafter be referred to as a "common cell length" for convenience.

While there are a few types of common cell length of standard cells in a whole LSI, a same common cell length is used as viewed locally as in a same circuit block for efficient laying of cells.

Thus, various types of standard cells having a same common cell length are prepared, and registered in a library. Generally, an arrangement space for a pattern of internal wiring and the like of a standard cell is limited in a common cell length direction.

On the other hand, there are various sizes in a direction (so-called horizontal direction) orthogonal to the common cell length direction of standard cells according to the scale of gate circuits. A cell size in the direction orthogonal to the common cell length will be referred to as an "arbitrary cell length" for convenience.

A part of an element isolation region and an impurity diffused layer for transistor formation in the above-described reserve cell for dealing with an ECO inherits standard specifications for standard cells.

However, specifications (standards) unique to ECO cells are determined for the gate electrode layer and the metallic wiring layer of the above-described reserve cell.

In the ECO cell aided design, a characteristic defect that does not satisfy a desire of the client is expected at a time of sample evaluation, or the characteristic defect may be found in actual sample evaluation. In this case, delay adjustment is made by a reserve cell (ECO cell). For example, a buffer or the like changed from an adjacent ECO cell is inserted into a path with too large an amount of delay. Inverters or the like changed from adjacent ECO cells and corresponding in number to a desired amount of additional delay are inserted into a path desired to be provided with an even larger amount of delay.

In addition, an ECO cell is used for recovery of a logical error.

In delay adjustment or recovery of a logical error by such an ECO cell, only upper layers from 1st contacts are additionally designed in the ECO cell adjacent to a path needing the adjustment or the recovery without the basic constitution or horizontal and vertical size of the ECO cell being changed. Thereby, a change is ultimately made from the reserve cell to a desired gate circuit cell (functionally identical to a standard cell) adjusted in delay from the standard cell read from the library at a position where the delay adjustment is necessary.

However, ECO cells are arranged in free spaces after arrangement of standard cells, and thus have limitations in the common cell length direction. It is therefore difficult to freely detour a metallic wiring layer in the common cell length direction.

When the detour is difficult, a connecting system is generally adopted which increases the number of layers of metallic wiring used and which eliminates a need for the detour in terms of a pattern via a higher metallic wiring layer. However, an increase in the number of layers of metallic wiring used raises manufacturing cost, and the semiconductor product may thus lose price competitiveness.

Incidentally, it is also important for circuit cells such as standard cells, ECO cells and the like not to be easily varied in transistor characteristics.

It is desirable to provide a semiconductor integrated circuit that can increase a degree of freedom of wiring without increasing the number of layers of metallic wiring and which has circuit cells in a pattern in which transistor characteristics are not varied easily.

In a first embodiment of the present invention, there is provided a semiconductor integrated circuit including: a plurality of standard cells including a transistor having a gate electrode and arranged in combination with each other; a metallic wiring layer interconnecting the plurality of standard cells to form a desired circuit; and a plurality of reserve cells having a gate electrode, unconnected with the metallic wiring layer and arranged on a periphery of the plurality of standard cells. In the semiconductor circuit, each of the gate electrodes of the plurality of standard cells and the plurality of reserve cells has a gate pad section and two gate finger sections extending from the gate pad section to sides opposite to each other in a predetermined direction, and length of the gate pad sections of the plurality of reserve cells in a direction orthogonal to the predetermined direction is equal to or more than a sum total value of three times a minimum line width in the metallic wiring layer and twice a minimum separation distance.

According to the semiconductor integrated circuit having such a constitution, a requirement that length of the gate pad sections of the reserve cells in the direction orthogonal to the gate finger sections be the predetermined value as described above (however, of course, the length should not exceed a cell size in this direction) is set. Thus, wiring intersection with a part of a gate pad section as a bridge line is made possible by a so-called underbridge structure, for example, without detouring the metallic wiring layer to an end side of a gate finger section. That is, this gate pad part has a length equal to or more than a sum total value of three times a minimum line width in the metallic wiring layer and twice a minimum separation distance, and the metallic wiring layer is made to intersect the central part of the length of the gate pad part. At this time, there is a room for allowing disposition of the metallic wiring layer at the minimum separation distance on both sides in a direction of width of the intersected metallic wiring layer. Thus, the metallic wiring layer can be connected on both one side and another end side of the bridge line (a part of the gate pad section).

The direction of the length of the gate pad part necessary as such a bridge line is desirably a so-called arbitrary cell length direction. The arbitrary cell length direction in this case is a direction orthogonal to the common cell length direction (predetermined direction) along the gate finger section. The common cell length is standardized into at least one type of length for ease of standard cell design and arrangement. On the other hand, cell length in the arbitrary cell length direction is free from such a regulation. The cell size in the arbitrary cell length direction may be slightly increased by applying the above-described requirement that the length of the gate pad section in the arbitrary cell length direction be the predetermined value or more. However, a size increase in the arbitrary cell length direction does not involve a disadvantage greater than the size increase, for example a great disadvantage of occurrence of unnecessary spaces as a result of impairing ease of arrangement obtained in cell-based circuit design.

The gate pad section is a part for supplying a voltage (signal) to a gate. When the gate pad section is at one side end of one long gate finger section, an electric field is applied to a transistor channel in a nonuniform manner in a direction of length of the gate finger section due to effect of gate resistance. When the manner of application of an electric field varies among transistors, characteristics of the transistors also tend to vary. While an electric field is applied uniformly when the gate pad section is present on both side ends of the gate finger section, cell size in the common cell length direction is increased by an amount corresponding to one gate pad section.

On the other hand, in the semiconductor integrated circuit according to the first embodiment, two gate finger sections extend from a gate pad section to sides opposite to each other in a predetermined direction (common cell length direction). This constitution remedies a difference in gate resistance, and nonuniformity in the manner of application of an electric field which nonuniformity is caused by the difference in gate resistance. As a result, variations in transistor characteristics are reduced without an increase in cell size in the common cell length direction being involved.

In a second embodiment of the present invention, there is provided a semiconductor integrated circuit including: a plurality of circuit cells including a transistor and arranged in combination with each other; and a metallic wiring layer interconnecting the plurality of circuit cells to form a desired circuit. In the semiconductor circuit, a gate electrode of the transistor within the plurality of circuit cells has a gate pad section and two gate finger sections extending from the gate pad section to sides opposite to each other in a predetermined direction, and length of the gate pad section in at least one of the plurality of circuit cells forming the desired circuit in a direction orthogonal to the predetermined direction is equal to or more than a sum total value of three times a minimum line width in the metallic wiring layer and twice a minimum separation distance.

In the second embodiment described above, the application of a requirement that the length of the gate pad section in the so-called arbitrary cell length direction be equal to or more than a sum total value of three times a minimum line width in the metallic wiring layer and twice a minimum separation distance is not limited to reserve cells. That is, a gate pad may be formed in so-called standard cells so as to satisfy the maximum length requirement enabling such an underbridge structure. Thus, in the second embodiment, "circuit cells" is used as a concept including reserve cells and standard cells.

According to the present invention, it is possible to provide a semiconductor integrated circuit that can increase a degree of freedom of wiring without increasing the number of layers of metallic wiring and size in the common cell length direction and which has circuit cells in a pattern not easily affected by variations in transistor characteristics.

DETAILED DESCRIPTION OF THE PREFERRED EMBODIMENT

A preferred embodiment of the present invention will hereinafter be described with reference to the drawings by taking as an example a semiconductor integrated circuit in which characteristic adjustment or recovery from a logical error by an ECO cell is applied to a standard cell.

The following description will be made in the following order.
1. General Layout
2. Configuration of ECO Cell
3. First Example of Wiring of ECO Cell
4. Second Example of Wiring of ECO Cell
5. Flow of Design Procedure
6. Examples of Modification <1. General Layout>

Figure 1A:
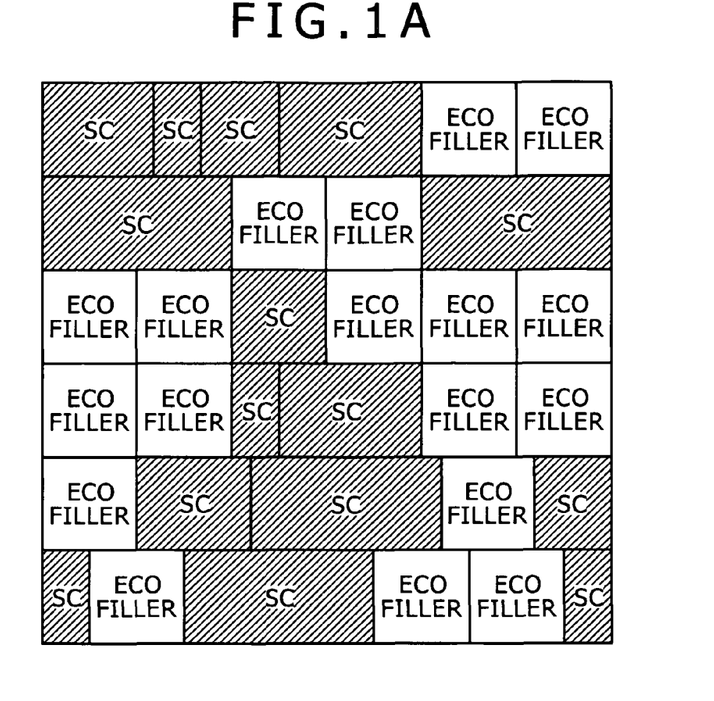
FIG. 1A is a diagram schematically showing the plane of an integrated circuit according to an embodiment with attention directed to a cell arrangement.

FIG. 1A is a diagram schematically showing the plane of an integrated circuit according to the embodiment with attention directed to a cell arrangement.

Each of square regions in FIG. 1A is referred to as a cell. Cells denoted by a reference "SC" are standard cells. Standard cells SC are functional circuit cells of an inverter, a NAND gate and the like, which are designed in advance, standardized, and registered in a library. Standard cells SC are a set of data, but may refer to a part of a device manufactured on the basis of the data. As will be described later in detail, in designing a semiconductor integrated circuit, standard cells registered in a library are combined and arranged. The arrangement substantially connects a power supply voltage line and a reference voltage line (for example a GND line) to each other on data. A desired circuit is obtained by connecting signal lines and the like after the arrangement. The arrangement and wiring up to this point is operation on data by a design aiding device.

FIG. 1A is a schematic plan view directing attention to the cell arrangement of the semiconductor integrated circuit. FIG. 1A is used also as a diagram of cell arrangement on data.

As shown in FIG. 1A, a desired circuit is realized by combining and arranging standard cells SC of various sizes. The desired circuit in this case can be realized arbitrarily according to the nature of the functional circuits of the individual standard cells SC and the combination of the standard cells SC as long as the desired circuit is a logic circuit. FIG. 1A is a generalized diagram, and the nature of the desired circuit itself is arbitrary.

A standard cell design system is used in design of an ASIC (Application Specific Integrated Circuit), an ASSP (Application Specific Standard Product) and the like. An ASIC is an IC developed and manufactured for a specialized use of each client. An ASSP is an IC developed and manufactured as a general-purpose part for a plurality of clients.

The size of a standard cell SC will be described below.

The standard cell SC is generally standardized or unified in cell length in a direction along one of two sides orthogonal to each other. This cell length direction will hereinafter be referred to as a "common cell length direction." The size in the common cell length direction (common cell length) is not limited to one type, but may be a few types, for example three types when the whole IC is viewed. However, as viewed locally as in one circuit block, the common cell length is one uniform length. In FIG. 1A, the same cell size is set in the vertical direction of the paper surface of FIG. 1A, and thus this direction is the common cell length direction.

The cell size can be determined arbitrarily in a direction orthogonal to the common cell length direction. However, a size that can be taken discretely (specified by a grid number) though arbitrary is generally determined due to requests for design efficiency and consistency. The direction orthogonal to the common cell length direction will hereinafter be referred to as an "arbitrary cell length direction."

In the present embodiment, in order to deal with an ECO, ECO cells (written as "ECO FILLER") are laid over free spaces around the standard cells SC.

The ECO cells have the same size as the standard cells SC in the common cell length direction. While the ECO cells have the same cell size in FIG. 1A, the ECO cells can take a few types of cell sizes in the arbitrary cell length direction.

The ECO cells are different from the standard cells SC in degree of contribution to the desired circuit.

The standard cells SC themselves form the desired circuit. On the other hand, the ECO cells are arranged as "reserve cells" that do not normally form the desired circuit.

When there is no problem in the arrangement and wiring of the standard cells SC, the ECO cells are given only the role of a filler for filling the free spaces. However, when there is an ECO (Engineering Change Order) from a client requesting design at a time of sample evaluation, it is necessary to deal with the ECO, and ECO cells are used at this time. A method of using ECO cells will be described later.

<2. Configuration of ECO Cell>

Figure 1B:
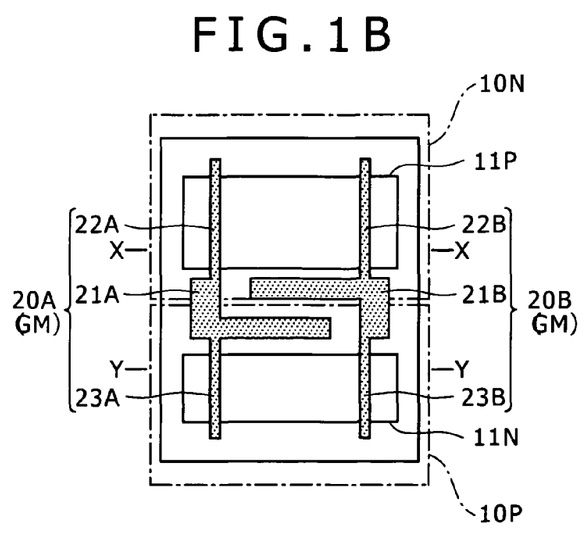
FIG. 1B is a plan view of an example of constitution of an ECO cell according to the embodiment.

FIG. 1B shows an example of configuration of an ECO cell.

The plan view of FIG. 1B is a diagram of layout of an ECO cell for realizing a most basic gate circuit such as an inverter, a NAND gate or the like.

A semiconductor substrate of the ECO cell shown in FIG. 1B has an N-type well (hereinafter referred to as an N-well) 10N for forming a PMOS transistor and a P-type well (hereinafter referred to as a P-well) 10P for forming an NMOS transistor. The N-well 10N and the P-well 10P are formed so as to be separated from each other in the common cell length direction within the semiconductor substrate.

Incidentally, impurity diffused layers (11P and 11N) forming a source region and a drain region or the like to be described later, for example, are formed inside the pattern of the N-well 10N and the P-well 10P. In addition, a well-in-well structure, or a triple well structure, for example, may be employed. Apart from whether the well-in-well structure is employed, the N-well 10N and the P-well 10P in FIG. 1B represent two substrate regions where no element isolation region is formed, and indicate that an N-type impurity layer or a part of the N-type impurity layer is formed on one side of the two substrate regions, and that a P-type impurity layer or a part of the P-type impurity layer is formed on the other side.

Incidentally, the well-in-well structure will be described later in the section of examples of modification.

The N-well 10N in the upper part of the paper surface of FIG. 1B in the common cell length direction will be referred to as a "PMOS formation region." The P-well 10P in the lower region of the paper surface of FIG. 1B will be referred to as an "NMOS formation region."

Two gate electrodes 20A and 20B composed of a gate metal layer GM are formed. The gate metal layer GM in this case has for example a structure of a polysilicon single layer or a multilayer structure of polysilicon and a high melting point metal. The gate electrodes 20A and 20B are formed simultaneously by processing the gate metal layer GM into a predetermined pattern by photolithography and etching.

Each of the gate electrodes 20A and 20B has a pattern in which one gate pad section and two gate finger sections are formed integrally.

More specifically, the gate electrode 20A has a gate pad section 21A disposed around a boundary between the PMOS formation region 10N and the NMOS formation region 10P. As in a desirable example shown in FIG. 1C, the gate pad section 21A has a pattern in an L-shaped form in which a metallic wiring intersecting section 211 that is long and narrow in the arbitrary cell length direction and a trunk section 212 are formed integrally. As in the desirable example shown in FIG. 1B and FIG. 1C, the gate electrode 20A has a gate finger section 22A extending from an end side of the trunk section 212 so as to intersect the P-type diffused layer 11P. The gate electrode 20A has a gate finger section 23A extending from the middle of a longer side of the metallic wiring intersecting section 211 so as to intersect the N-type diffused layer 11N.

The width of the gate finger sections 22A and 23A defines the so-called gate length of the transistors. The length of a part of the gate finger section 22A which part intersects the P-type diffused layer 11P defines the so-called gate width of the PMOS transistor. The length of a part of the gate finger section 23A which part intersects the N-type diffused layer 11N defines the so-called gate width of the NMOS transistor.

Similarly, the gate electrode 20B has a gate pad section 21B disposed around the boundary between the PMOS formation region 10N and the NMOS formation region 10P. As with the gate pad section 21A, the gate pad section 21B desirably has a pattern in an L-shaped form in which a metallic wiring intersecting section 211 and a trunk section 212 are formed integrally.

In this case, the gate pad section 21B is disposed in the vicinity of the gate pad section 21A. At this time, the gate pad sections 21A and 21B are disposed in the vicinity of each other such that the L-shapes of the gate pad sections 21A and 21B are combined with each other and the gate pad sections 21A and 21B as a whole are contained in a rectangular region. Such an arrangement in which the L-shapes of the gate pad sections 21A and 21B are combined with each other and the gate pad sections 21A and 21B are contained in a rectangular region is not essential. However, when the gate pad sections have an L-shape, such a combination arrangement saves the entire arrangement area most, and is desirable in that sense.

The gate pad section 21B has the pattern of a figure obtained by rotating the gate pad section 21A by 180 degrees.

Figure 1C:
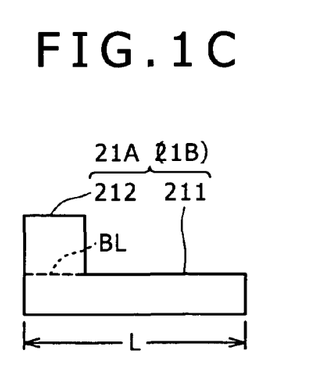
FIG. 1C is an enlarged view of a gate pad section.

Thus, as shown in FIG. 1B and FIG. 1C, the gate electrode 20B has a gate finger section 22B extending from the middle of a longer side of the metallic wiring intersecting section 211 in the gate pad section 21B so as to intersect the P-type diffused layer 11P. The gate electrode 20B has a gate finger section 23B extending from an end side of the trunk section 212 so as to intersect the N-type diffused layer 11N.

The width of the gate finger sections 22B and 23B defines the so-called gate length of the transistors. The length of a part of the gate finger section 22B which part intersects the P-type diffused layer 11P defines the so-called gate width of the PMOS transistor. The length of a part of the gate finger section 23B which part intersects the N-type diffused layer 11N defines the so-called gate width of the NMOS transistor.

As shown in FIG. 1C, the gate pad sections 21A and 21B each have a predetermined length L in the arbitrary cell length direction. The "length in the arbitrary cell length direction" refers to the size of a largest part in the direction. In addition, the predetermined length L assumes a value satisfying a requirement that the predetermined length L be "equal to or more than a sum total value of three times a minimum line width in a metallic wiring layer and twice a minimum separation distance." Incidentally, an upper limit of the predetermined length L is the cell size in the arbitrary cell length direction. Contents signifying this requirement are clear when connections in the metallic wiring layer are necessary, and will thus be described later in the section of examples of wiring of ECO cells.

As long as this requirement is satisfied, the shapes of the gate pad sections 21A and 21B are arbitrary, and do not need to be the L-shape.

When there is a logical error (connection error) in the desired circuit formed by standard cells SC, ECO cells (ECO FILLER) are connected as a part of the desired circuit to recover the logical error.

It becomes clear in some cases that an erroneous operation (erroneous logical inversion) tends to occur because the estimation of an amount of delay differs, for example, though there is no connection error. In this case, for insusceptibility to the erroneous operation, ECO cells are connected as a part of the desired circuit, and delay adjustment is made.

In addition, at a time of recovering the logical error, delay adjustment may be needed simultaneously.

Connection of the metallic wiring layer is made in ECO cells at necessary positions only in the above-described cases where the ECO cells are necessary.

A few examples of wiring (of the metallic wiring layer) of the ECO cell will be described in the following.

<3. First Example of Wiring of ECO Cell>

Figure 2:
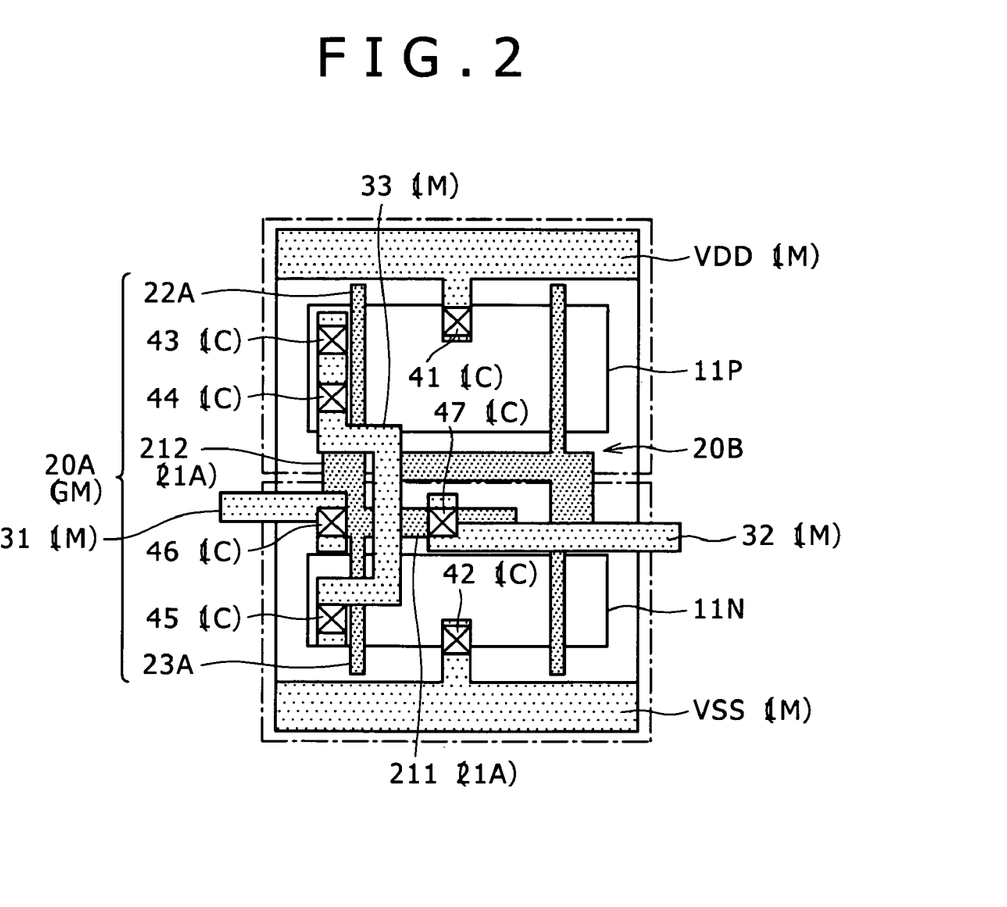
FIG. 2 is a plan view of an inverter shown as an example after wiring in the ECO cell according to the embodiment.

FIG. 2 shows an example of wiring of the ECO cell when an inverter allowing input to be taken from either of a left side and a right side of the paper surface is realized.

The layout of the ECO cell shown in FIG. 2 is made by adding the layout of contacts (1st contacts: 1C) in a first layer provided in a first interlayer insulating film not shown in the figure and a metallic wiring layer of a first layer (first wiring layer: 1M) to the ground layout of FIG. 1B.

More specifically, as shown in FIG. 2, gate finger sections of the gate electrode 20A and the gate electrode 20B divide the P-type diffused layer 11P into three parts.

The wide central part of the three diffused layer parts of the P-type diffused layer 11P is connected via a 1st contact 41 (1C) to a branch part of a power supply voltage supplying line VDD formed of the first wiring layer (1M) over the 1st contact 41. A trunk line of the power supply voltage supplying line VDD is disposed in the arbitrary cell length direction along a cell boundary.

Similarly, the other gate finger sections of the gate electrode 20A and the gate electrode 20B divide the N-type diffused layer 11N into three parts.

The wide central part of the three diffused layer parts of the N-type diffused layer 11N is connected via a 1st contact 42 (1C) to a branch part of a reference voltage supplying line VSS formed of the first wiring layer (1M) over the 1st contact 42. A trunk line of the reference voltage supplying line VSS is disposed in the arbitrary cell length direction along a cell boundary on an opposite side from the power supply voltage supplying line VDD.

A PMOS transistor is formed which has the gate finger section 22A of the gate electrode 20A intersecting the P-type diffused layer 11P as a gate. The source region of the PMOS transistor is formed in the P-type diffused layer part connected to the 1st contact 41 (1C). The P-type diffused layer part on an opposite side from the P-type diffused layer part connected to the 1st contact 41 (1C) with the gate finger section 22A interposed between the P-type diffused layer parts forms the drain region of the PMOS transistor.

Two 1st contacts 43 (1C) and 44 (1C) are formed on the drain region of the PMOS transistor.

An NMOS transistor is formed which has the gate finger section 23A of the gate electrode 20A intersecting the N-type diffused layer 11N as a gate. The source region of the NMOS transistor is formed in the N-type diffused layer part connected to the 1st contact 42 (1C). The N-type diffused layer part on an opposite side from the N-type diffused layer part connected to the 1st contact 42 (1C) with the gate finger section 23A interposed between the N-type diffused layer parts forms the drain region of the NMOS transistor.

One 1st contact 45 (1C) is formed on the drain region of the NMOS transistor.

The gate pad section 21A is provided as a gate part having a role of connecting the gates of the PMOS transistor and the NMOS transistor and a role of a contact (landing) pad.

A 1st contact 46 (1C) is formed near one end part of the metallic wiring intersecting section 211 of the gate pad section 21A. A first input line 31 (1M) is connected to the 1st contact 46 (1C).

A 1st contact 47 (1C) is formed on a side near another end part of the metallic wiring intersecting section 211. A second input line 32 (1M) is connected to the 1st contact 47 (1C).

The first input line 31 (1M) and the second input line 32 (1M) may be provided alternatively according to on which side in the arbitrary cell length direction (on which of the left side and the right side of the paper surface of FIG. 2) a gate circuit in a stage preceding the inverter is disposed. Alternatively, the second input line 32 (1M) may be used to branch into a path in which a signal from the first input line 31 is passed through the ECO cell (inverter) shown in FIG. 2 and then output and a path in which the signal is not passed through the ECO cell (inverter).

The metallic wiring intersecting section 211 is formed in the shape of a strip long in the arbitrary cell length direction for a purpose of widening a region between the two 1st contacts 46 (1C) and 47 (1C).

A drain connecting line 33 (1M) as a kind of internal connecting line is disposed between the two 1st contacts 46 (1C) and 47 (1C) so as to be orthogonal to the metallic wiring intersecting section 211. One end part side of the drain connecting line 33 (1M) is connected to the drain region of the PMOS transistor via the 1st contacts 43 (1C) and 44 (1C). Another end part side of the drain connecting line 33 (1M) is connected to the drain region of the NMOS transistor via the 1st contact 45 (1C).

Though not specifically shown in FIG. 2 because the direction of output is not determined, the output can be taken out from the drain connecting line 33 (1M) in either direction (of a left direction and a right direction of the paper surface of FIG. 2) in the arbitrary cell length direction.

For such a metallic wiring intersecting section 211, the first wiring layer (1M) can be orthogonal to the vicinity of the central part of the metallic wiring intersecting section 211, and contacts can be provided on both sides of the orthogonal part. A requirement of a minimum length (reference "L" in FIG. 1C) of the metallic wiring intersecting section 211 for this is a length where three pieces of wiring and two spaces between the pieces of wiring can be formed supposing that the width of contacts is the same as wiring layer width. In other words, a requirement imposed on the metallic wiring intersecting section 211 is to satisfy a condition that the length of the metallic wiring intersecting section 211 in the arbitrary cell length direction be "equal to or more than a sum total value of three times a minimum line width in the metallic wiring layer and twice a minimum separation distance."

COMPARATIVE EXAMPLE

Figure 3A:
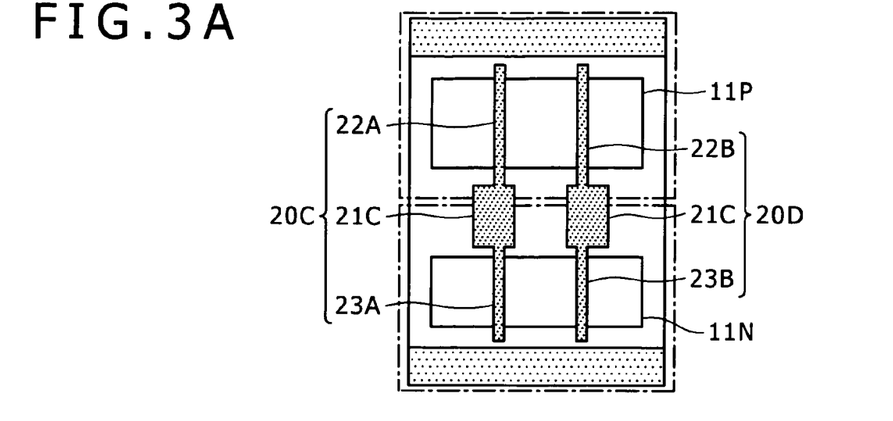
FIG. 3A is a plan view of an ECO cell according to a comparative example.
Figure 3B:
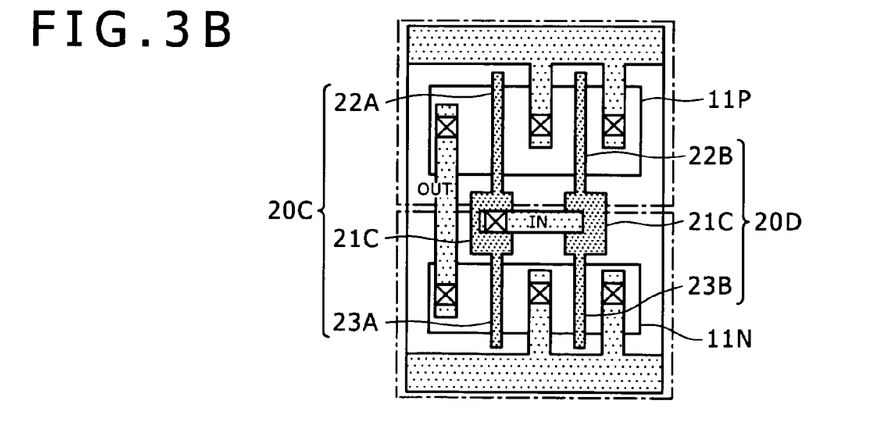
FIG. 3B is a plan view of an inverter after wiring in the ECO cell according to the comparative example.
Figure 3C:
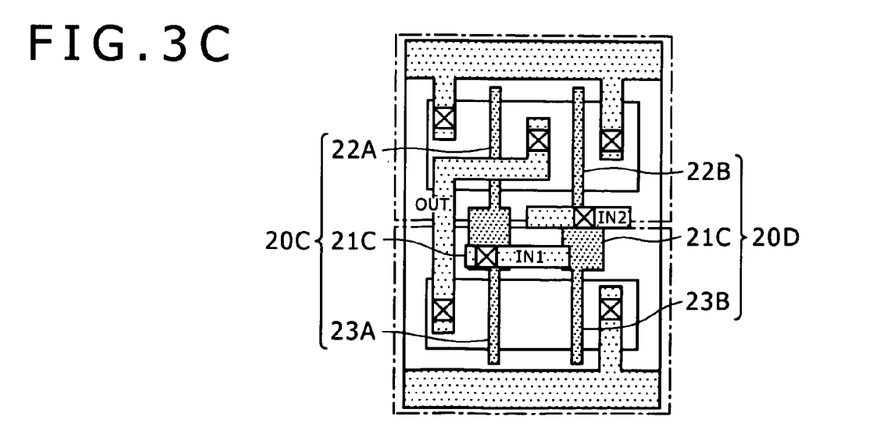
FIG. 3C is a plan view of a NAND gate circuit shown as an example of wiring of another comparative example.

FIGS. 3A, 3B, and 3C show an ECO cell to which the present invention is not applied as opposed to the ECO cell shown in FIG. 1B and FIG. 2. FIG. 3A shows the ECO cell when wiring is not connected yet. FIG. 3B and FIG. 3C show the ECO cell after the wiring. FIG. 3B represents a case where an inverter (INV.) cell is realized by the wiring. FIG. 3C represents a case where a NAND cell is realized by the wiring.

Gate electrodes 20C and 20D shown in FIGS. 3A to 3C have two gate finger sections (22A and 23A or 22B and 23B). These two gate finger sections intersect a P-type diffused layer 11P and an N-type diffused layer 11N, respectively. The gate electrodes 20C and 20D have the constitution of the gate finger sections in common with the gate electrodes 20A and 20B in FIG. 1B and FIG. 2.

The gate electrodes 20C and 20D are different from the gate electrodes 20A and 20B in the shape of gate pad sections. Gate pad sections 21C of the gate electrodes 20C and 20D in the comparative example have a rectangular shape. This rectangular shape is of such a size as to simply play a role of a contact landing pad.

The inverter (INV.) shown in FIG. 3B does not use a gate on a right side, which fact itself is not essential.

What is important in this case is that the gate pad sections 21C are of a rectangular shape and of a size without the predetermined length L in the arbitrary cell length direction which length can be intersected by a wiring layer as in FIG. 2. Thus, the position of a wiring layer forming an input (IN) and an output (OUT) are fixed in the arbitrary cell length direction. In the example of FIG. 3B, the input (IN) is fixed for input from the right side of the paper surface, and the output (OUT) is fixed for output to the left side of the paper surface. Thus, in order that the input and the output may be on either side in the arbitrary cell length direction as in FIG. 2, the provision of a space for wiring to detour by sacrificing gate width or use of a second wiring layer (2M) as an even higher layer is essential.

Also in a case where a branch path in which a signal does not go through the inverter is provided, the provision of a space for wiring to detour by sacrificing gate width or use of a second wiring layer (2M) as an even higher layer is essential.

In the two-input NAND circuit shown in FIG. 3C, an output (OUT) can produce output to either of the left and the right. However, the wiring of the output (OUT) is an obstacle to two inputs, that is, a first input (IN1) and a second input (IN2). Thus, in order to assign the first input (IN1) and the second input (IN2) to one of the left and the right arbitrarily, the provision of a space for wiring to detour by sacrificing gate width or use of a second wiring layer (2M) as an even higher layer is essential. Also in a case where a branch path in which a signal does not go through the NAND gate is provided, the provision of a space for wiring to detour by sacrificing gate width or use of a second wiring layer (2M) as an even higher layer is essential.

On the other hand, the present embodiment shown in FIG. 2 enables the input and the output to be assigned to the left and the right arbitrarily. In addition, a through path in which a signal does not go through the ECO cell can be provided. At this time, it is not necessary to provide a space for wiring to detour by sacrificing gate width. Further, it is not necessary to use a second wiring layer (2M) as an even higher layer.

Thus, a degree of freedom of wiring can be enhanced without the number of layers of metallic wiring being increased.

<4. Second Example of Wiring of ECO Cell>

Figure 4:
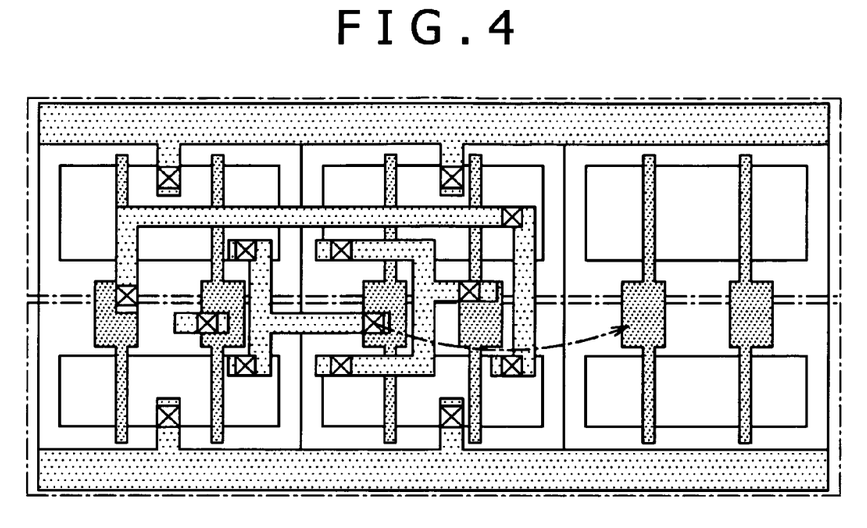
FIG. 4 is a plan view of another example of wiring of a comparative example.
Figure 5:
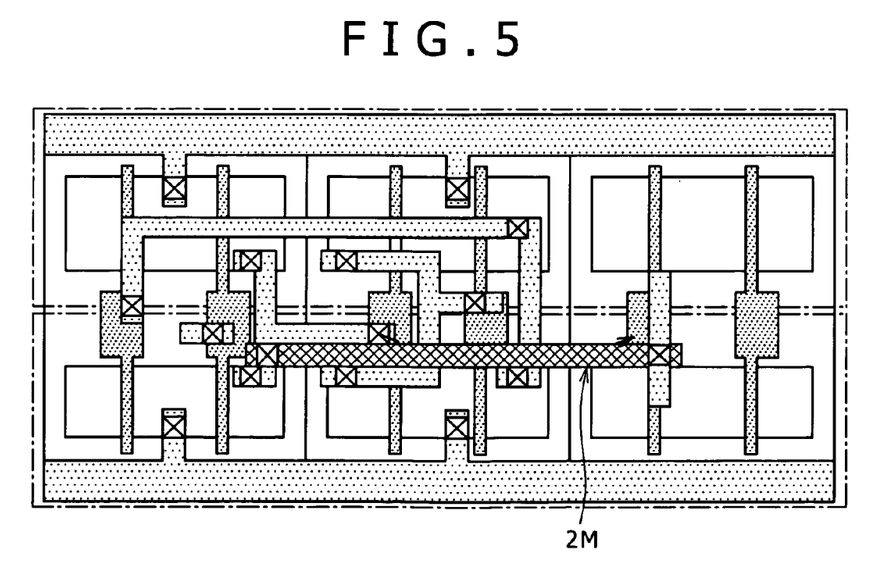
FIG. 5 is a plan view of another example of wiring of a comparative example.
Figure 6:
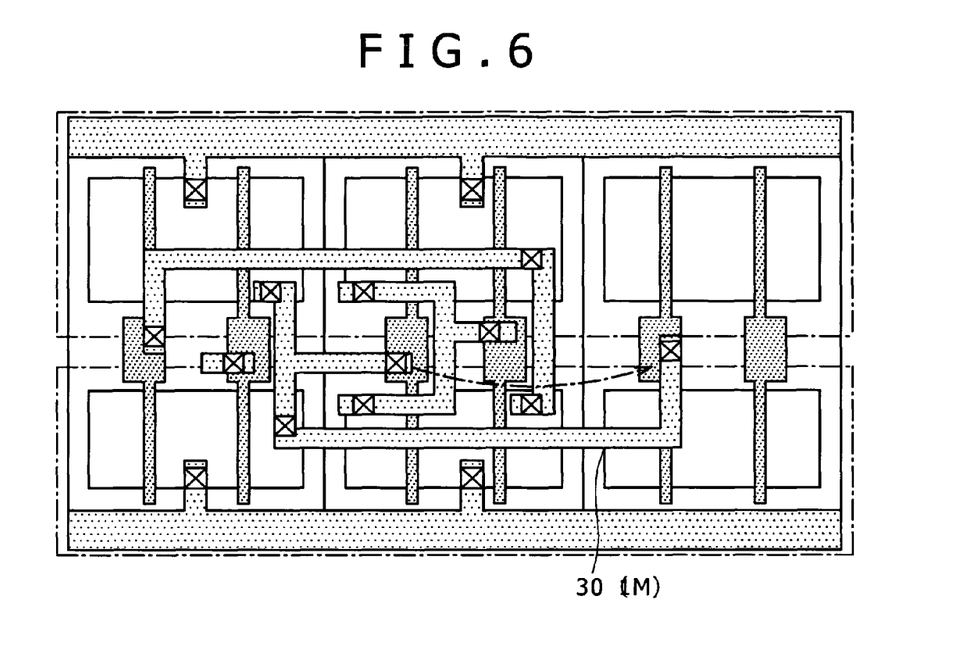
FIG. 6 is a plan view of another example of wiring of a comparative example.
Figure 7:
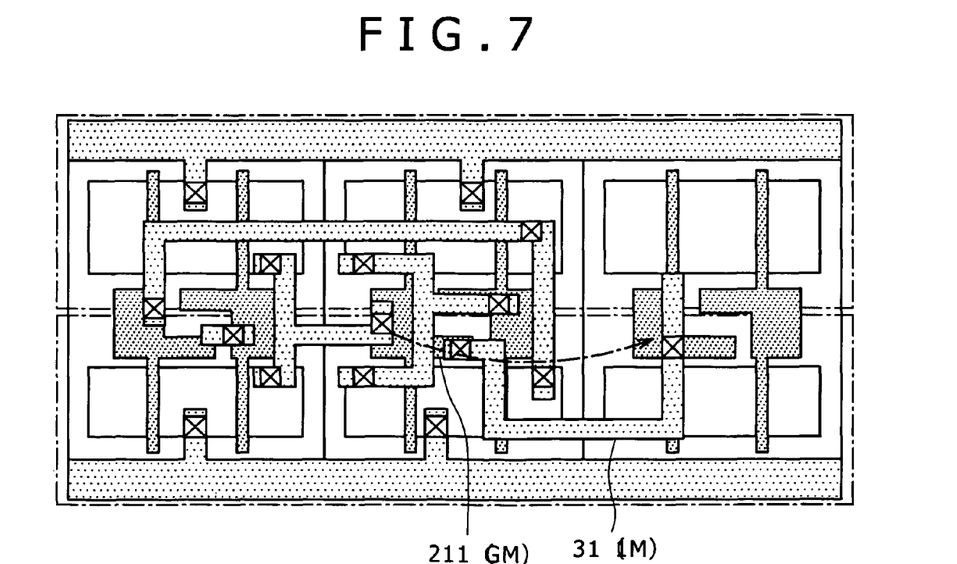
FIG. 7 is a plan view of an example of wiring to which the present invention is applied as opposed to FIGS. 4 to 6.

FIG. 7 is a diagram showing the layout of a second example of wiring in the present embodiment. FIGS. 4 to 6 show comparative examples of the second example of wiring.

A circuit realized by ECO cells shown in these figures is an example when wiring is more complex. In order to obtain a desired characteristic, a connection between nodes as indicated by a dashed and dotted line in FIG. 4 needs to be established with as short a wiring length as possible.

For such a proposition indicated in the comparative example (FIG. 4), the comparative example of FIG. 5 uses a metallic wiring layer of an even higher second layer (second wiring layer: 2M), and thus has a disadvantage of correspondingly increasing manufacturing cost.

The comparative example of FIG. 6 has a long connecting line 30 (1M) for forming a detour route instead of using the second wiring layer (2M). The detour route in this case is possible only in a case of standard cells SC in a block that is large in the common cell length direction and which has a margin for wiring.

In contrast to the comparative examples shown in FIG. 5 and FIG. 6, the second example of wiring to which the present invention is applied as in FIG. 7 has a shorter connecting line 31 (1M) for forming a detour route than the connecting line 30 (1M) in FIG. 6. This is because a contact for the connecting line 31 is provided at an end part of a metallic wiring intersecting section 211 (GM) of a gate pad section. As a result, wiring is possible without inviting an increase in cost due to the use of the second wiring layer 2M, an increase in the common cell length direction, or the like.

As shown by the above-described second example of wiring, the present invention can be carried out to optimize the ease of wiring by examples of application of the invention.

<5. Flow of Design Procedure>

A request for a circuit change after design (ECO) occurs in a stage of sample evaluation within an own company or by a client. Because a large amount of additional cost is incurred once a photomask is fabricated and after a product or a sample is fabricated, a design system using the ECO is excellent in that the design system makes a circuit change after the photomask relatively easy.

Thus, a design system using such an ECO is generally referred to as a "Post Mask ECO." The "Post Mask ECO" is an effective system for recovering an error in timing estimation which error is revealed after LSI trial manufacture or a logical error in a short turnaround time (TAT).

Figure 8:
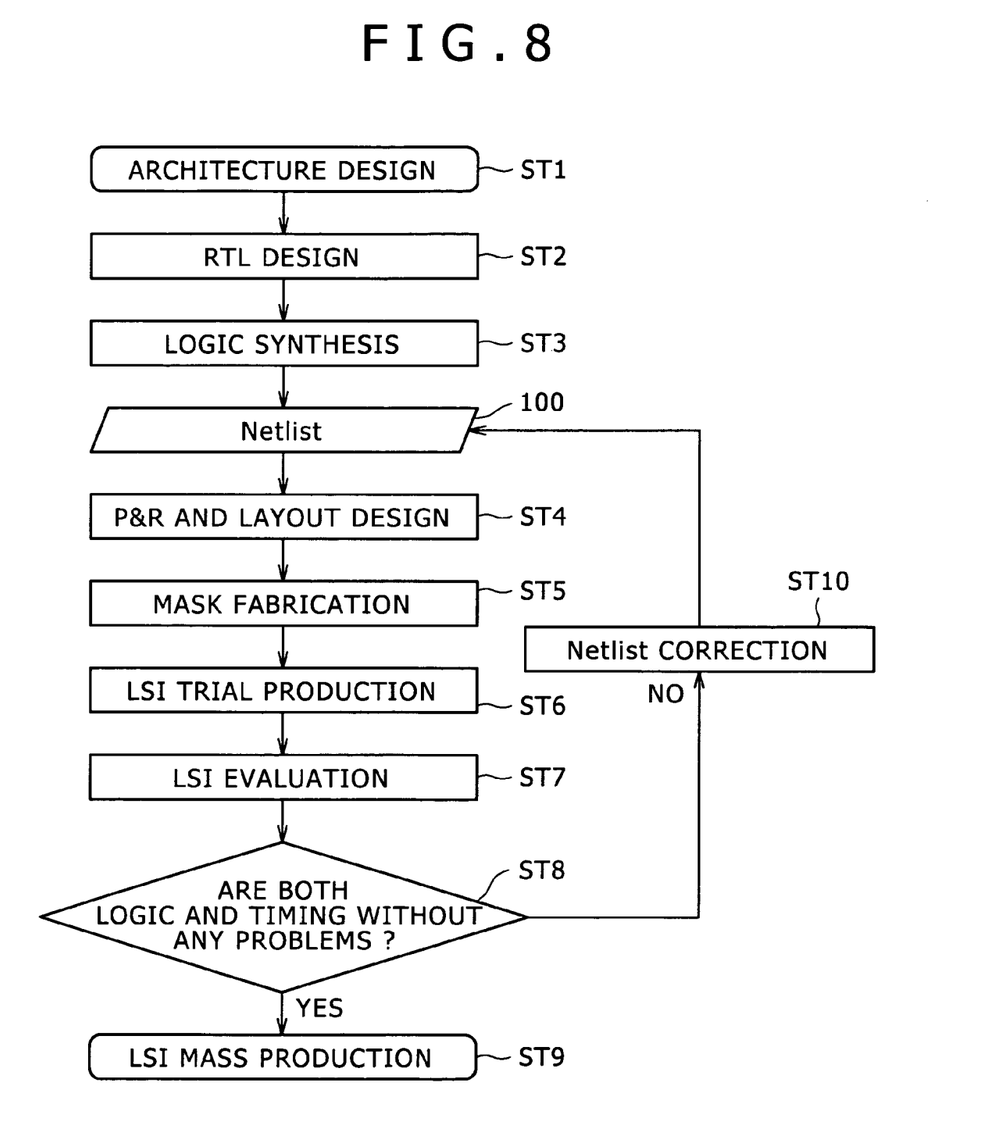
FIG. 8 is a flowchart describing the procedure of a design method in the embodiment.

FIG. 8 shows a flow of LSI design including a flow of the "Post Mask ECO."

In LSI design, an architecture design is made in step ST1. A register transfer level (RTL) design is made in step ST2. A net list (Netlist) 100 is created by a synthesis tool from the RTL in step ST3. The net list refers to the data of information on connection between terminals in an electronic circuit.

In step ST4, the net list 100 is input to a placement and routing (P&R) tool, and a layout design is made.

In making layout design of a block based on standard cells, the P&R tool places standard cells in an optimum position from the net list 100 and timing limitations.

Figure 9:
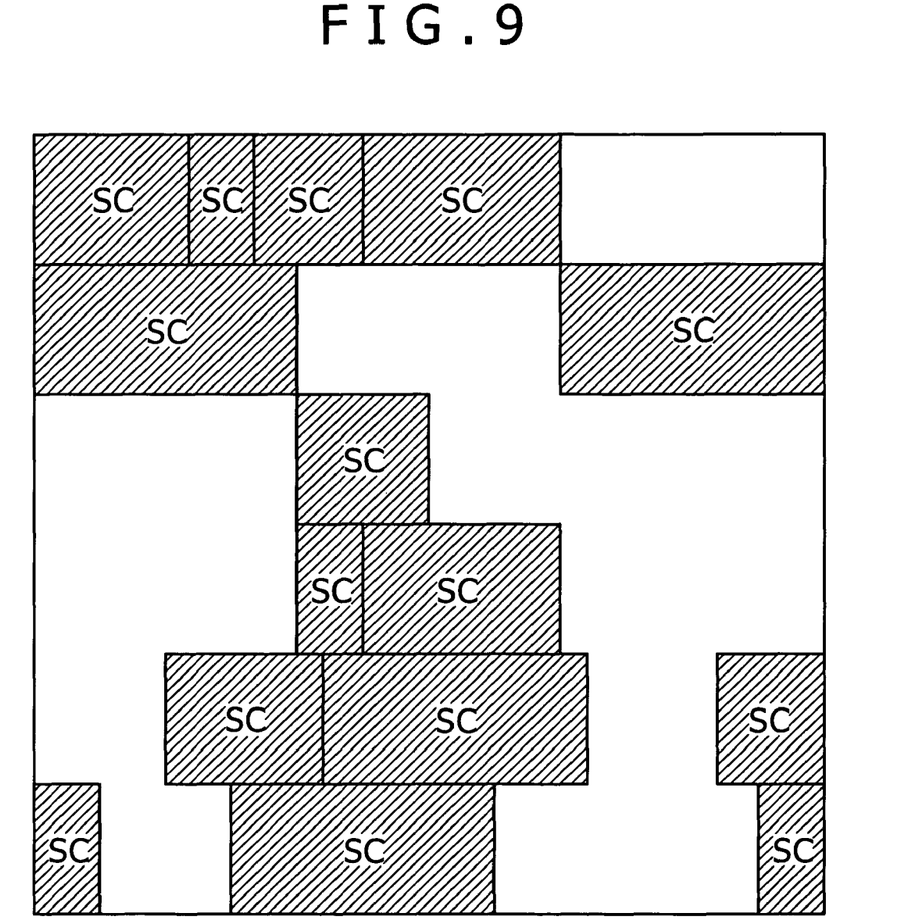
FIG. 9 is a plan view immediately after arrangement of standard cells.

FIG. 9 shows a state after standard cells SC are placed and wired.

In a stage of FIG. 9, as shown by comparison with FIG. 1A, free spaces occur in places around the standard cells SC. A ratio of occurrence of free spaces is said to be generally about 10 percent to 30 percent, though different depending on the use of the LSI or the like.

In the flow of the "Post Mask ECO" shown in FIG. 8, ECO cells (ECO FILLER) are laid over places where the standard cells SC are not placed, as shown in FIG. 1A.

The "Post Mask ECO" system provides two kinds of ECO cells, that is, an ECO filler and an ECO logic cell (ECO LOGIC CELL). ECO logic cells shown in the first example of wiring or the second example of wiring described above may be created by wiring ECO fillers. However, for a shorter TAT, the "Post Mask ECO" system registers a logic cell in an anticipated circuit form in a library in advance, and replaces an ECO filler at an occurrence position with the logic cell.

ECO fillers have a layout form as shown in FIG. 3A (comparative example) or FIG. 1B (present embodiment).

The layout forms have already been described, and therefore description thereof will be omitted in the following.

Returning to FIG. 8, a photomask (Mask) is fabricated in step ST5. In step ST6, an LSI is produced on a trial basis using the fabricated photomask. The LSI produced on a trial basis is evaluated in step ST7 to determine whether a correct output is obtained in response to a predetermined input, whether a correct output is obtained even when an input is intentionally delayed to a certain extent, and whether a correct output is obtained even when there is a frequency variation or a voltage variation, for example.

When there is no logical error and there is a sufficient timing margin, it is determined that there is no problem in step ST8. The flow proceeds to step ST9, where mass production is started.

When a problem is detected in step ST8, a net list correction is made in step ST10, and thus the net list 100 used for placement and routing is rewritten.

Thereby a logical error, if any, is corrected. When there is a shift in timing due to an excess or a deficiency of an amount of delay, a circuit part is corrected by an ECO cell for decreasing the amount of delay or increasing the amount of delay in a path having the problem.

The layout design by placement and routing, the photomask fabrication, the LSI trial production, and the LSI evaluation in steps ST4 to ST7 are performed again. When it is determined in step ST8 that the problem is solved, the process proceeds to mass production in step ST9. However, when problem solution is insufficient, or when another problem is found, steps ST4 to ST8 and step ST10 are repeated until the problem is solved.

In making layout design again, correction is made in the flow of the "Post Mask ECO" by disposing a desired ECO logic cell in a position where an ECO filler has been disposed.

At this time, an error can be corrected by only making correction in upper layers from 1st contacts (1C). When the circuit has a proven track record or specifications requested by a client are not stringent, for example, prior evaluation may be performed on a part of LSIs at a time of mass production without trial production as in FIG. 8 being performed. That is, when the TAT is desired to be shortened, a wafer lot (a set of wafers to be processed in one period) at the time of mass production of LSIs in which processing is completed up to gates is set on standby in advance. A part of wafers or an evaluation chip is evaluated with a package assembly as an evaluation sample. When no problem is found in the evaluation, the other wafers of the same wafer lot are manufactured and mass-produced.

Thereby the TAT can be shortened.

Advantages derived from the constitution of the above ECO cells will be described below in detail.

A first advantage is that wiring is possible without sacrificing the gate width of transistors even when common cell length (so-called cell height) is small.

Generally, the cell height (cell size in the common cell length direction) of ECO cells included in an ASIC, an ASSP and the like based on standard cells needs to coincide with that of the standard cells SC. As recent semiconductors have been miniaturized and increased in degree of integration, the height (cell size in the common cell length direction) of standard cells SC has been decreasing. Thus, the layout design of ECO cells is becoming difficult.

A second advantage is excellent compatibility with pad arrangements for suppressing variations in transistor characteristics.

As semiconductors have been miniaturized, variations at a transistor level have been increasing. Therefore the pattern shape of a gate metal (GM) needs to be such a shape as to make an electric field applied to a channel uniform. There is thus greater limitation on the pattern shape of the gate metal (GM).

Specifically, when a contact is provided between a first wiring layer (1M) and the gate metal (GM) at both end parts in the common cell length direction of a standard cell SC, transistor performance is varied at the time of manufacturing. Thus a contact needs to be provided at the central part of the (standard) cell.

The gate pad sections 21A and 21B having the metallic wiring intersecting section 211 according to the present embodiment facilitate intersections of wiring and the gate metal at the central part of the cell in which part the intersections of the wiring and the gate metal concentrate. Thus, the present invention can be suitably applied in combination with the shape of a gate electrode when there is great limitation on the pattern shape of the gate metal (GM) due to a need for disposing a gate pad section around the central part in the common cell length direction. As a result, an excellent transistor characteristic is obtained in an ECO cell used so as to be added to the desired circuit.

A third advantage is that a metallic wiring layer can be formed by only a minimum of a first wiring layer (1M).

The number of metallic layers used in layout design of standard cells SC has a great impact on LSI manufacturing cost.

It is important especially for an LSI desired to be at low cost such as an ASIC or the like to have a small number of metallic layers.

A node change (level transition of a wiring layer being used) occurs in the layout design of standard cells SC.

Specifically, the layout design is made with (GM+1M) or (GM+1M+2M: second wiring layer). In this case, of course, (GM+1M+2M) uses more metallic wiring layers, and thus increases LSI manufacturing cost.

When standard cells are designed with (GM+1M), layout is easy as compared with ECO cells because the shape of gates can be determined freely.

On the other hand, the shape of gates of ECO cells is fixed. Thus, when layout design is made with (gate+1M), a gate shape needs to be devised so as to enable node change.

In this respect, the present embodiment makes it possible to form an underbridge structure by the shape of the metallic wiring intersecting section instead of node change using the second wiring layer 2M. Thus, cost can be reduced by an amount corresponding to a small number of wiring layers used. Incidentally, cell size in the arbitrary cell length direction may be increased slightly by applying the present invention. However, there is a margin for cell expansion in the arbitrary cell length direction. In addition, cell expansion in the arbitrary cell length direction is performed into unnecessary regions in most cases, thus not leading to any disadvantage. Even if the cell expansion is disadvantageous, the cell expansion does not disturb arrangement regularity unlike cell expansion in the common cell length direction, and is thus not a great disadvantage.

Incidentally, node change equally needs to be made in a standard cell and an ECO cell. The underbridge structure is used in either cell.

Generally, in the case of a standard cell, the plane pattern shape of the gate (and impurity diffused layer) can be determined freely, and therefore an underbridge structure can be made relatively easily.

On the other hand, in the case of an ECO cell, intra-cell connection or inter-cell connection needs to be made by only 1st contacts (1C) and a first wiring layer (1M) after a gate shape is determined first. It is thus more difficult to make an underbridge structure in an ECO cell than in a standard cell.

The present invention can be applied to either of standard cells and ECO cells. However, for the above-described reasons, the present invention has great effects when applied to ECO cells.

As described above, according to the present embodiment, it is possible to provide a semiconductor integrated circuit that can increase a degree of freedom of wiring without increasing the number of layers of metallic wiring and which has circuit cells in a pattern in which transistor characteristics are not varied easily.

<6. Examples of Modification>

The above description has been made of a case where the plane pattern shape of an ECO cell is an L-shape as shown in FIG. 1B, for example. At this time, the gate pad section 21A may be of any shape as long as at least the necessary length L shown in FIG. 1C is obtained. However, as already described, combining the L-shapes of two gate pad sections on the left and the right as shown in FIG. 1B makes the entire arrangement efficient, and reduces space.

When three or more gates are arranged, the gate pad section of a gate other than the two gates on both sides preferably maintain the relation of FIG. 1B to another gate pad section disposed on one of the left and the right. In the case of three gates, the gate pad section of the central gate is formed into a pattern at least partially having an L-shape that can be combined with another gate pad section disposed on either of the left and the right. "At least partially having" in this case is to the effect that a part other than a part having the L-shape does not need to exist and that when the part other than the part having the L-shape exists, the shape of the part other than the part having the L-shape is arbitrary.

Supposing that the gate pad section 21B of the gate electrode 20B in FIG. 1B is the central gate pad section, the L-shapes of the central gate pad section and another gate pad section 21A on the left of the central gate pad section have a relation to each other as in FIG. 1B. Supposing conversely that the gate pad section 21A of the gate electrode 20A in FIG. 1B is the central gate pad section, the L-shapes of the central gate pad section and another gate pad section 21B on the right of the central gate pad section have a relation to each other as in FIG. 1B.

In the above description, a gate pad section in an ECO cell is desired to satisfy the requirement of a minimum length L of the gate pad section.

However, this requirement may be satisfied by a standard cell SC. Thus, it suffices for at least one of an ECO cell and a standard cell SC to satisfy the requirement of the minimum length L for a gate pad section.

Description will next be made of an example of a sectional structure including a well-in-well structure.

Figure 10A:
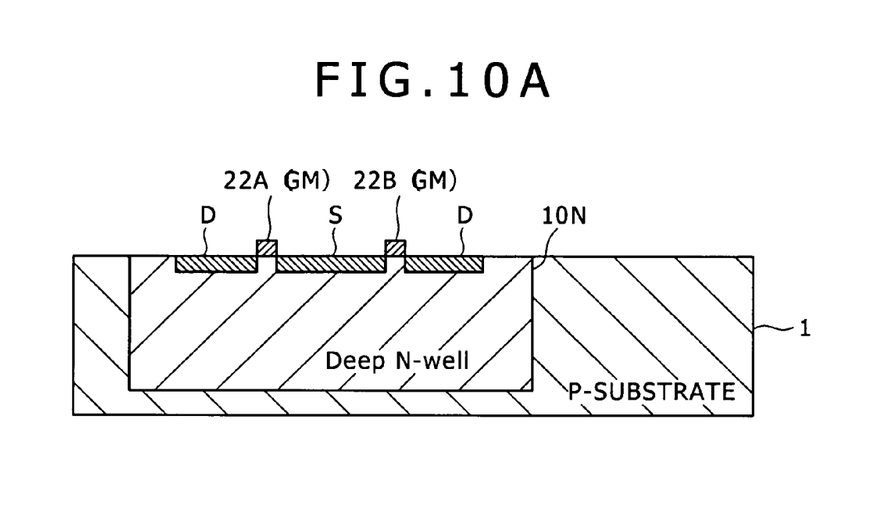
FIGS. 10A and 10B are schematic sectional views of an integrated circuit showing a well structure.
Figure 10B:
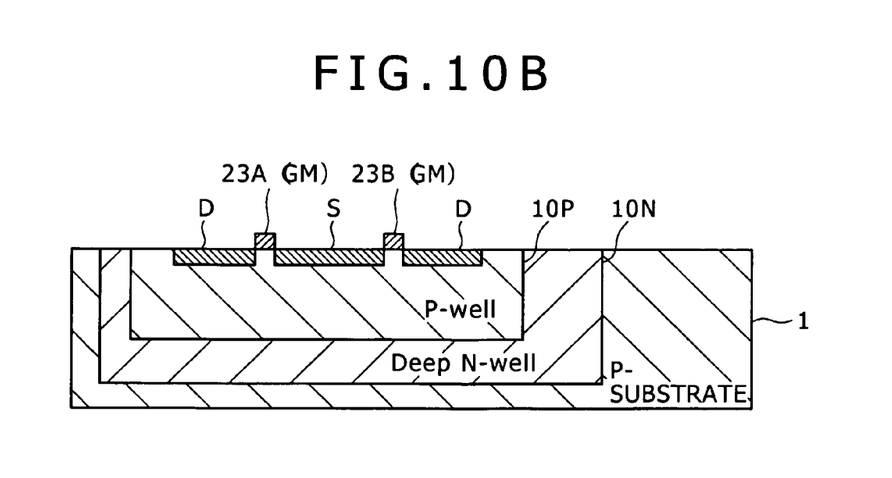

FIG. 10A is a schematic sectional view taken along a line X-X in FIG. 1B. FIG. 10B is a schematic sectional view taken along a line Y-Y in FIG. 1B.

A semiconductor integrated circuit illustrated in FIG. 10A and FIG. 10B is formed in a P-type semiconductor substrate (P-substrate 1) made of P-type silicon or the like.

An N-well 10N is formed large and deep within the P-substrate 1. The N-well 10N is therefore referred to as a "deep N-well."

As shown in FIG. 10B, a P-well 10P having a smaller area and a shallower junction than the N-well 10N is formed within the N-well 10N.

The N-well 10N shown in FIG. 1B represents a part opened from an element isolation region not shown in the figure in a plane pattern. Similarly, the P-well 10P shown in FIG. 1B represents a part opened from an element isolation region not shown in the figure in a plane pattern.

Incidentally, such a well-in-well structure may be adopted arbitrarily.

The present application contains subject matter related to that disclosed in Japanese Priority Patent Application JP 2009-012955 filed in the Japan Patent Office on Jan. 23, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor integrated circuit comprising:
a plurality of standard cells including a transistor having a gate electrode and arranged in combination with each other;
a metallic wiring layer interconnecting said plurality of standard cells to form a desired circuit; and
a plurality of reserve cells having a gate electrode, unconnected with said metallic wiring layer and arranged on a periphery of said plurality of standard cells, wherein
each of the gate electrodes of said plurality of standard cells and said plurality of reserve cells has a gate pad section and two gate finger sections extending from said gate pad section to sides opposite to each other in a predetermined direction, and
length of the gate pad sections of said plurality of reserve cells in a direction orthogonal to said predetermined direction is equal to or more than a sum total value of three times a minimum line width in said metallic wiring layer and twice a minimum separation distance.

2. The semiconductor integrated circuit according to claim 1,
wherein said predetermined direction is a common cell length direction in which one cell length is a predetermined uniform length, and
said gate pad sections of said plurality of reserve cells have a metallic wiring intersecting section whose length in an arbitrary cell length direction orthogonal to said common cell length direction is equal to or more than the sum total value of three times the minimum line width in said metallic wiring layer and twice the minimum separation distance.

3. The semiconductor integrated circuit according to claim 2, wherein said gate pad sections of said plurality of reserve cells have a trunk section and said metallic wiring intersecting section, and said metallic wiring intersecting section has an L-shaped plane pattern part extending from said trunk section to at least one side in said arbitrary cell length direction.

4. The semiconductor integrated circuit according to claim 3,
wherein said plurality of reserve cells have a plurality of said gate electrodes including said gate pad section,
two said gate pad sections adjacent to each other within a reserve cell each have said L-shaped plane pattern part including said trunk section and said metallic wiring intersecting section, and
the L-shaped plane pattern part of one of said two gate pad sections and the L-shaped plane pattern part of the other gate pad section are combined with each other so as to be contained in a rectangular region and are arranged in proximity to each other.

5. The semiconductor integrated circuit according to claim 1,
wherein said plurality of reserve cells have a plurality of said gate electrodes including said gate pad section, and
at least respective parts of two said gate pad sections adjacent to each other within a reserve cell are combined with each other so as to be contained in a rectangular region and are arranged in proximity to each other.

6. The semiconductor integrated circuit according to claim 1,
wherein said semiconductor integrated circuit has a plurality of circuit blocks, and
an identical cell length in said predetermined direction within at least an identical circuit block is shared between said plurality of standard cells and said plurality of reserve cells, between the plurality of standard cells, and between the plurality of reserve cells.

7. The semiconductor integrated circuit according to claim 1,
wherein the metallic wiring layer is connected to at least one predetermined reserve cell among said plurality of reserve cells, whereby said predetermined reserve cell forms a part of said desired circuit, and
said predetermined reserve cell uses a part having a length equal to or more than the sum total value in said gate pad section as an underbridge line, first metallic wiring in the metallic wiring layer intersects a central part of said underbridge line, and second metallic wiring and third metallic wiring in the same metallic wiring layer as said first metallic wiring are connected to one end part side and another end part side of said underbridge line.

8. A semiconductor integrated circuit, comprising:
a plurality of circuit cells including a transistor and arranged in combination with each other; and
a metallic wiring layer interconnecting said plurality of circuit cells to form a desired circuit,
wherein a gate electrode of said transistor within said plurality of circuit cells has a gate pad section and two gate finger sections extending from said gate pad section to sides opposite to each other in a predetermined direction, and
length of said gate pad section in at least one of the plurality of circuit cells forming said desired circuit in a direction orthogonal to said predetermined direction is equal to or more than a sum total value of three times a minimum line width in said metallic wiring layer and twice a minimum separation distance.

* * * * *